(12) United States Patent
Bangert et al.

(10) Patent No.: US 7,575,662 B2
(45) Date of Patent: Aug. 18, 2009

(54) METHOD FOR OPERATING A SPUTTER CATHODE WITH A TARGET

(75) Inventors: Stefan Bangert, Steinau (DE); Wolfgang Buschbeck, Hanau (DE); Markus Hanika, Landsberg (DE); Karl-Albert Keim, Budingen (DE); Michael Konig, Frankfurt am Main (DE); Jorg Krempel-Hesse, Eckartsborn (DE); Andreas Lopp, Freigericht (DE); Harald Rost, Mainhausen (DE); Jurgen Schroeder, Grosskkrotzenburg (DE); Tobias Stolley, Frankfurt am Main (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 666 days.

(21) Appl. No.: 11/170,640

(22) Filed: Jun. 29, 2005

(65) Prior Publication Data
US 2006/0254905 A1 Nov. 16, 2006

(30) Foreign Application Priority Data
May 13, 2005 (EP) .................................. 05010419

(51) Int. Cl.
*C23C 14/35* (2006.01)
(52) U.S. Cl. .............................. 204/192.12; 204/298.12; 204/298.21; 204/298.22; 204/298.26; 204/298.27
(58) Field of Classification Search .................. None
See application file for complete search history.

(56) References Cited

U.S. PATENT DOCUMENTS

| | | | |
|---|---|---|---|
| 5,215,638 A | 6/1993 | Hausler | |
| 6,303,008 B1 | 10/2001 | Pichulo et al. | |
| 6,365,010 B1 * | 4/2002 | Hollars | 204/192.12 |
| 6,793,785 B2 | 9/2004 | Teng et al. | |
| 2004/0231973 A1 * | 11/2004 | Sato et al. | 204/192.12 |

FOREIGN PATENT DOCUMENTS

| | | |
|---|---|---|
| DE | 41 17 368 A1 | 12/1992 |
| DE | 41 26 236 A1 | 2/1993 |
| EP | 703599 A1 * | 3/1996 |

(Continued)

OTHER PUBLICATIONS

Machine Translation of Description section, EP 703599 A1, Dresse. Mar. 1996.*

(Continued)

*Primary Examiner*—Nam X Nguyen
*Assistant Examiner*—Jason M Berman
(74) *Attorney, Agent, or Firm*—Fulbright & Jaworski L.L.P.

(57) ABSTRACT

The invention relates to a method for operating a magnetron sputter cathode, in particular a tube cathode or several tube cathodes forming an array. In such cathodes a target passes through a magnetic field, whereby induction currents flow in the target which distort the magnetic field. This results in the nonuniform coating of a substrate. By having the relative movement between magnetic field and target alternately reverse its direction, the effect of the magnetic field distortion can be compensated. This yields greater uniformity of the coating on a substrate to be coated.

14 Claims, 3 Drawing Sheets

FOREIGN PATENT DOCUMENTS

| | | |
|---|---|---|
| EP | 0703599 B1 | 12/1997 |
| JP | 11029866 | 2/1999 |
| JP | 2004019006 | 1/2004 |
| WO | WO-82/02725 A | 8/1982 |

OTHER PUBLICATIONS

Wright, et al., "Design advances and applications of the rotatable cylindrical magnetron", Journal of Vacuum Science and Technology: Part A., Amer. Instit. Of Physics. New York, (1986).

* cited by examiner

METHOD FOR OPERATING A SPUTTER CATHODE WITH A TARGET

BACKGROUND AND SUMMARY OF THE INVENTION

This application claims priority from European Patent Application No. 05 010 419.9 filed May 13, 2005, hereby incorporated by reference in its entirety.

FIELD OF THE INVENTION

The invention relates to a method for operating a sputter cathode with a target.

Material layers to be applied onto a substrate—for example a synthetic film or glass—are frequently applied by means of the so-called sputter process. This sputter process proceeds in a vacuum chamber in which is located a plasma.

In this process by means of the ions in the plasma, particles are knocked out of the target, which subsequently are deposited on a substrate opposite the target.

The target is connected to a cathode to which a negative voltage is applied, which accelerates positive ions from the plasma.

In order to knock the largest possible number of particles out of the target, employed in the proximity of this target are magnets whose magnetic field penetrates through the target. Hereby the electrons responsible for the ionization of the plasma are bunched in the proximity of the surface of the target. The combination of cathode and permanent magnet is also referred to as "magnetron".

If cathode and target are planar, the magnetron is referred to as a planar magnetron.

However, for some time hollow cylindrical magnetrons are increasingly utilized due to their high target material yield. These magnetrons are sometimes also called tube cathodes.

On the outer side of a tubular cathode is located a target which is also tubular. The tubular target rotates about the longitudinal axis of the cathode, with magnets being stationarily disposed in the cathode. The magnetic field of these magnets penetrates cathode and target and consequently is also disposed in the plasma.

By "tube cathode" are often also understood entire units which comprise a motor, a rotary transmission leadthrough, bearings, electric sliders, cooling means lines and a magnet system, the magnet system together with a portion of the target cooling being disposed in the cylindrical target.

A sputter device with a magnetron cathode with rotating target is already known in which the target is cooled in a special way (DE 41 17 368 A1).

In another known rotating magnetron cathode on two opposing sites of the cathode magnets are provided such that two substrates can be provided simultaneously with a sputter coating (DE 41 26 236 A1).

Lastly, there is also known a rotating cathode for cathode sputtering, which supports a tubular structural part, capable of rotating about its axis, and on its circumference at least one material to be sputtered (EP 0 703 599 B1). This rotating cathode includes additionally a magnet system as well as mechanical means which during the sputtering make possible an oscillating rotary motion of the tubular structural part. This is intended to solve the problem involved in providing a method for the rapid exchange of the target material of a cathode for magnetron-assisted cathode sputtering. In order to attain uniform erosion in a configuration with two rotating different targets, each of which is developed in the form of a semicylinder, the rotating cathode during the deposition is allowed to oscillate at an amplitude which is less or equal to $\alpha/2$. In the case of two different targets, it is $\alpha=180°$.

The aim of the invention is eliminating the negative effect of the induction current on the coating quality in a sputter cathode with a target being moved through a magnetic field.

This aim is attained according to the present invention.

The invention consequently relates to a method for operating a magnetron sputter cathode, in particular a tube cathode or several tube cathodes forming an array. In such cathodes a target passes through a magnetic field whereby induction currents flow in the target distorting the magnetic field. This causes a nonuniform coating of a substrate. Thereby that the relative movement between magnetic field and target alternately reverses its direction, the effect of the magnetic field distortion can be compensated. This leads to greater uniformity of the coating on a substrate to be coated.

The advantage achieved with the invention comprises in particular that the deformations of the coating thickness distribution occurring in the case of a tube cathode or tube cathode configuration with conductive target material rotating continuously in one direction are avoided.

Embodiment examples of the invention are shown in the drawing and will be described in the following in further detail.

DETAILED DESCRIPTION

Figure 1:
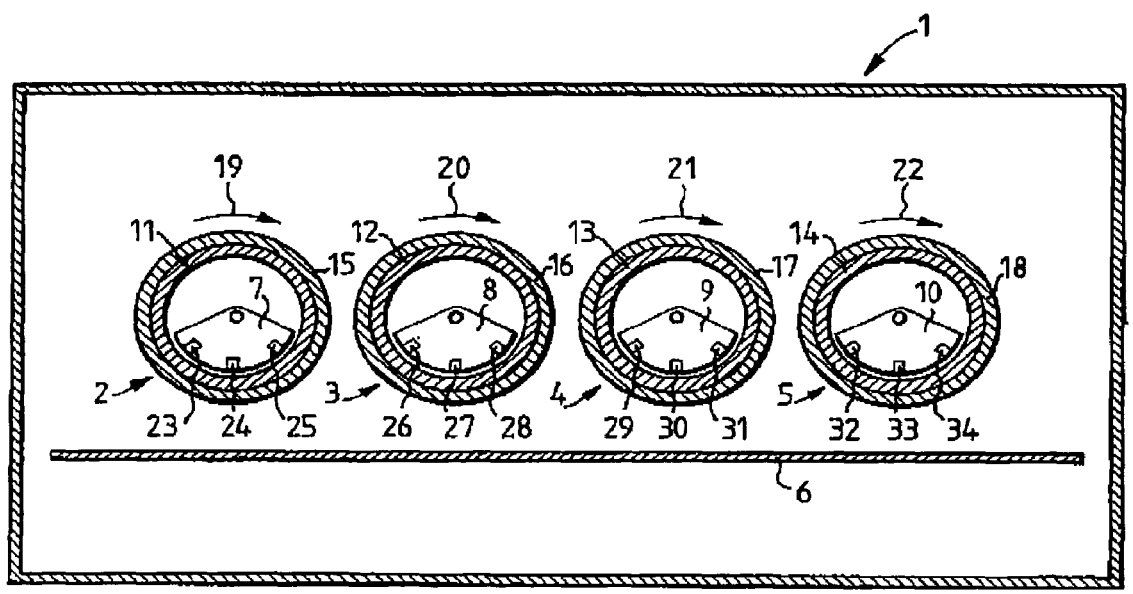
FIG. 1 several tube cathodes disposed in parallel in a sputter chamber.

FIG. 1 shows a section through a vacuum chamber 1, in which are located four rotatable tube cathodes 2 to 5. Opposite to these tube cathodes 2 to 5 is disposed a substrate 6 to be coated, for example a glass panel.

Each of the tube cathodes 2 to 5 comprises a circular arc-shaped magnet yoke 7 to 10 as well as a bearing tube 11 to 14, on whose outer side is disposed a cylindrical target 15 to 18.

In the depiction of FIG. 1, the tubes 11 to 14 with associated targets 15 to 18 rotate in the direction of arrows 19 to 22, thus in the clockwise direction. However, they can also rotate in the counterclockwise direction.

In the circular arc-shaped magnet yokes 7 to 10 are disposed three permanent magnet series 23 to 34, of which the permanent magnet series 23, 25; 26, 28; 29, 31 and 32, 34 have the same polarity, while the permanent magnet series 24, 27 and 30, 33, respectively, located between them have the opposite polarity. The magnet yokes 7 to 10 with permanent magnet series 23 to 34 are disposed stationarily, i.e. the do not rotate with the tubes 11 to 14 and the targets 15 to 18.

If the targets 15 to 18 are sputtered with a configuration according to FIG. 1, on the surface of the substrate a coating is deposited which is comprised of the same material as the target. In the case of reactive sputtering the material sputtered off the target can additionally also enter into a chemical reaction and form a compound before it is deposited on the substrate. Since the tube cathodes 2 to 5 cannot be packed indefinitely closely, they have a spacing from one another which causes inhomogeneous coating perpendicularly to the longitudinal axes of the tube cathodes 2 to 5 projecting into the plane of drawing.

Figure 2:
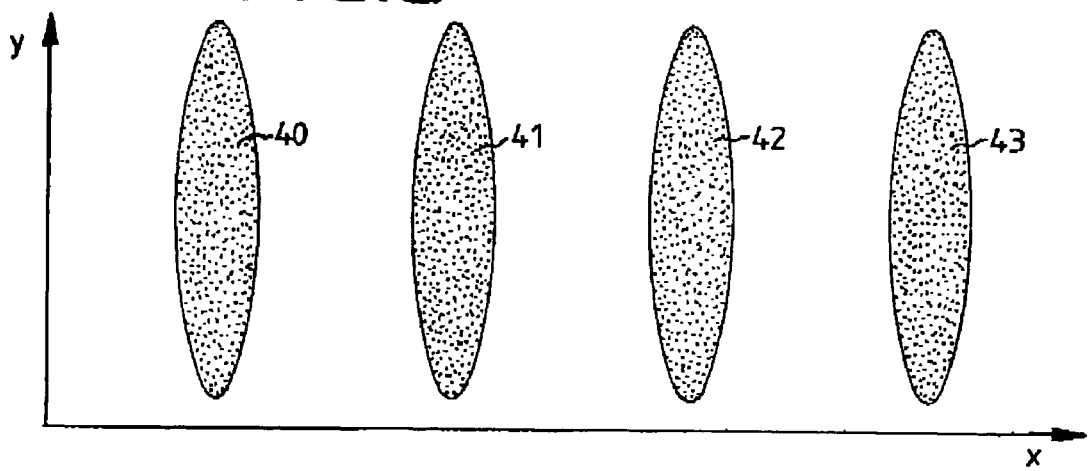
FIG. 2 the coating thickness distribution on a substrate under a static operation of a sputter unit with several tube cathodes.

FIG. 2 shows the manner in which extends the resistance distribution of a metallic coating when the tube cathodes 2 to 5 do not rotate, i.e. if sputtering is carried out in the static state. The rotational axes of the tube cathodes 2 to 5 are oriented in the y-direction. This y-direction is the direction into the plane of drawing of FIG. 1. The x-direction denotes the horizontal direction in FIG. 1. The ellipses 40 to 43 denote the regions of high electric resistance, i.e. low coating thickness on the substrate. They are located directly beneath the individual tube cathodes 2 to 5 on the substrate. The main axes of the ellipses 40 to 43, consequently, extend beneath the rotational axes of the tube cathodes 2 to 5 and denote regions of high electric resistance. Since directly beneath the tube cathodes the magnetic fields are weaker than in the margin regions of the tube cathodes, less sputter material is also deposited here. However, directly beneath the tube cathodes a lesser deposition of the target material occurs, which is reflected in a lesser coating thickness and therewith in an increased electric resistance. The ellipses 40 to 43 show the regions of increased electric resistance; in practice they are relatively narrow.

Figure 3:
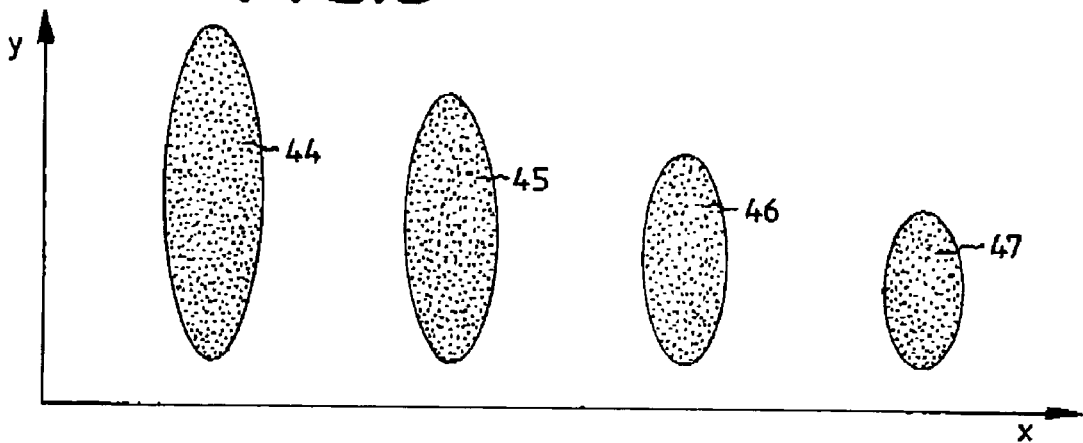
FIG. 3 the coating thickness distribution on a substrate under dynamic operation of a sputter unit with several cathodes, with the cathodes rotating in a first direction.

FIG. 3 shows the resistance distributions of the material sputtered onto the substrate 6 if all of the tube cathodes 2 to 5 rotate in the clockwise direction, thus in the direction of arrows 19 to 22.

It can be seen that the distribution of the regions of increased resistance along the rotational axes of the individual tube cathodes 2 to 5 is no longer uniform, i.e. the ellipses become increasingly smaller with increasing x-distance. The observed effect of the length change of the ellipses also occurs in the case of single cathodes; however, it only becomes distinctly noticeable with cathode arrays with several cathodes. The mechanism for the increase of the shift of the region with less coating, and therewith high electric resistance in the y-direction, is not completely known. It is possible that through the overlapping plasma zones a disturbance is transmitted from cathode to cathode so that the effect is augmented.

Figure 4:
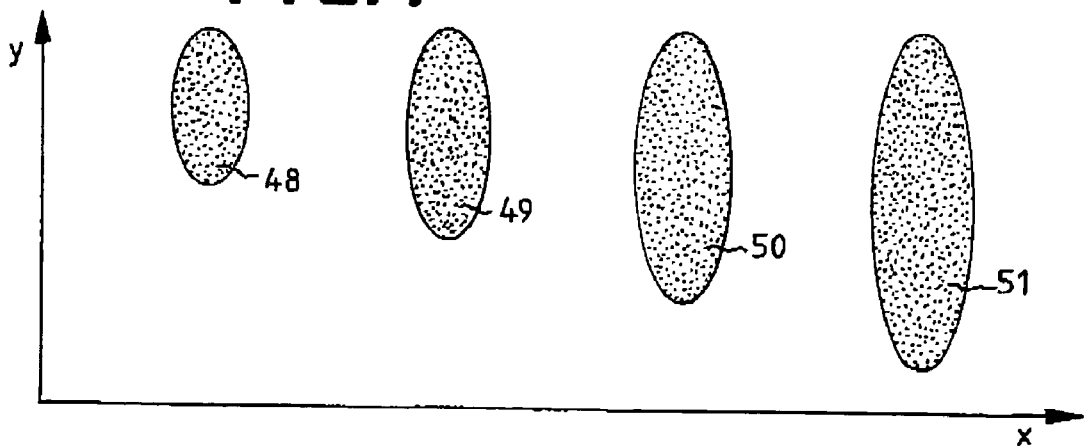
FIG. 4 the coating thickness distribution on a substrate under dynamic operation of a sputter unit with several cathodes, with the cathodes rotating in a second direction.

FIG. 4 shows the distribution of the increased resistance in the case in which the tube cathodes 2 to 5 rotate counterclockwise. The distribution of increased resistance of the sputtered material on substrate 6 is also not uniform in this case, but it is in the reverse sense, i.e. the ellipses become continuously greater with increasing distance x.

It is evident that the asymmetries of the regions of low deposition during the rotation in the clockwise direction, on the one hand, and in the counterclockwise direction, on the other hand, are contradirectional. During the rotation in the clockwise direction (FIG. 3) the main axes of the ellipses 44 to 47 become shorter in the x-direction, while the main axes of the ellipses 48 to 51 during rotation in the counterclockwise direction in the x-direction become longer.

If the tube cathodes 2 to 5 rotate for a time t1 and at a specified rate in the clockwise direction and subsequently for the same time t1 at the same rate in the counterclockwise direction, one obtains again the distribution depicted in FIG. 2, i.e. the same distribution as in static sputtering. Two contradirectional errors, so to speak, compensated. In order to obtain optimum uniformity of the coating on the substrate, however, it is not necessary for all cathodes to rotate always at precisely the same circumferential speed and in the same direction. Rather, the circumferential speeds and the durations of the revolution can vary. This applies especially if the individual cathodes have fabrication tolerances. In this case the circumferential speeds, etc. should be adapted to the particular cathodes.

Figure 5:
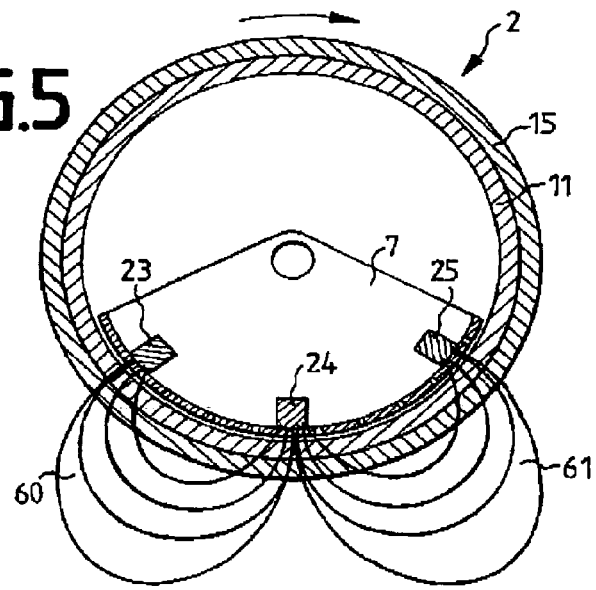
FIG. 5 cross section through a tube cathode.

The tube cathode 2 of FIG. 1 is once again depicted in FIG. 5 at an enlarged scale. In this representation are shown the field lines 60, 61 of the magnetic field set up by the permanent magnets 23 to 25.

It can be seen that the field lines extend symmetrically with respect to the tube cathode 11 and to the target 15 and that the magnetic field strength directly beneath the tube cathode is weaker than laterally to it.

This symmetric orientation of the field lines applies to static operation, i.e. if the tube cathode 2 does not rotate about the stationary permanent magnets 23 to 25. However, if the tube cathode 2 does rotate about these permanent magnets 23 to 25, the field lines of the permanent magnets 23 to 25 are intersected by the target 15. The electrons located in an electrically conducting target are hereby subjected to forces perpendicular to the direction of motion of target 15 and to the direction of the field lines, i.e. perpendicularly to the plane of drawing. This causes a voltage U or an electric field strength E to occur in this direction in the target since the electrons are non-uniformly distributed along the longitudinal axis of target 15. The electric field strength E can be calculated by means of the equation $E_i=v \times B$, if $E_i$ is the induced electric field strength, v the circumferential speed of the target and B the magnetic field strength of the permanent magnets 23 to 25. Thereby an induced current results, which, in turn, sets up a magnetic field, which becomes superimposed on the present magnetic field of the permanent magnets 23 to 25. The resulting magnetic field is hereby distorted, which causes the asymmetries depicted in FIGS. 3 and 4.

The deformation of the coating thickness distribution occurs in the longitudinal direction of the cathode as well as also perpendicularly to it.

The magnetic fields shown in FIG. 5 are tilted off to one side through the superimposed magnetic fields, and specifically during rotation to the right into the one, and, in the case of rotation to the left, into the opposite direction. Through changes of equal length in the direction of rotation, the error occurring with the rotation in one direction can be compensated through the oppositely directed error, which occurs during rotation in the opposite direction. Accordingly, through defined time proportions of the direction of rotation, the distribution can be shifted specifically along the y-direction.

Through the currents induced in the target strong forces are also generated between the target and the permanent magnets 23, 24, 25, which are opposite to the direction of rotation of the target. The effect described here in conjunction with rotating tube cathodes occurs correspondingly also during dynamic operation of planar cathodes, if between target and magnetic field a relative movement takes place.

Figure 6:
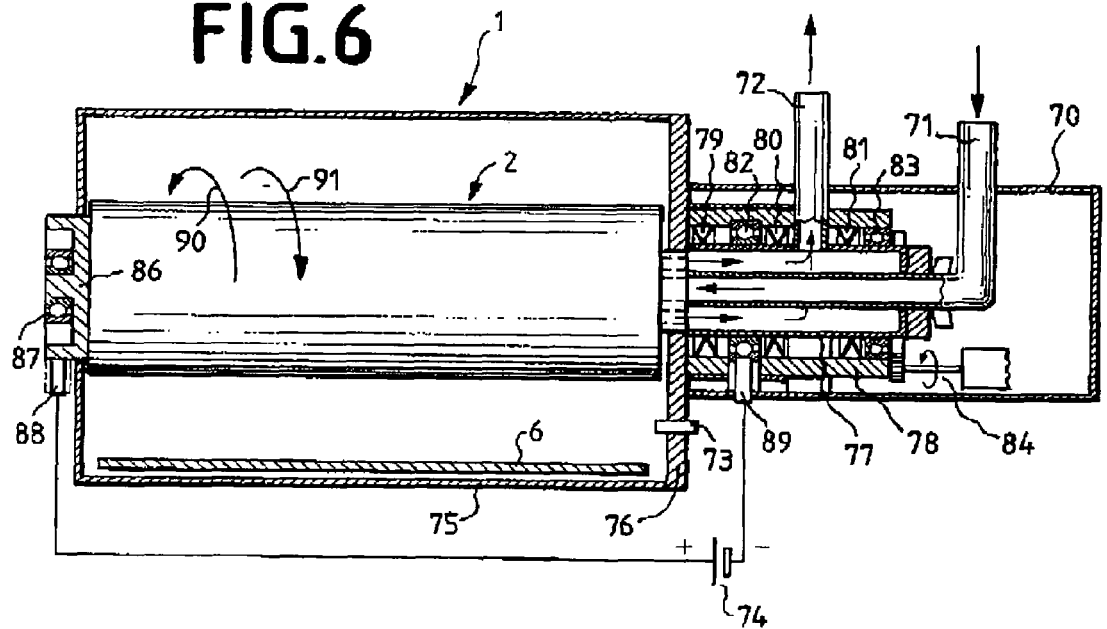
FIG. 6 longitudinal section through a plasma chamber.

FIG. 6 depicts a longitudinal section through the chamber 1 with the tube cathode 2. The tube cathode 2 can be set into rotational motion by a drive located in a fitting 70. In addition, at this fitting 70 are also provided a fluid inlet 71 and a fluid outlet 72. Beneath the tube cathode 2 is located the substrate 6 to be coated. A gas inlet is denoted by 73, located opposite of which is a (not shown) gas outlet on the opposing side of the vacuum chamber 1.

The tube cathode 2 is connected to the negative pole of a voltage source 74, here shown as a DC voltage source. The positive pole of the voltage source 74 is connected with the bottom 75 of the vacuum chamber 1. A receptacle wall 76 separates the vacuum obtaining in the vacuum chamber 1 from the atmosphere encompassing the fitting 70. In the fitting 70 is disposed a fluid pipe 77, which encompasses the fluid inlet 71 and the fluid outlet 72. Disposed coaxially about the fluid pipe 77 is a pipe 78 of an electrically nonconducting material. Between the two pipes 77 and 78 are disposed the sealing rings 79, 80, 81 and two arrangements of bearings 82, 83. In front of the arrangement of bearings 83 is a rotary driving unit 84, which rotates the tube cathode 2. At the other end of the tube cathode 2 rests a fitting 86 of this tube cathode 2 in a bearing 87. By 88, 89 are denoted the power supplies to which are connected the poles of the DC voltage source 74.

Although FIG. 6 shows only one tube cathode, in the vacuum chamber 1 are located several tube cathodes perpendicularly to the plane of drawing. These tube cathodes can each be provided with their own driving unit. However, it is also possible to employ one driving unit for several tube cathodes.

In one embodiment the rotary driving unit 84 can be provided for rotation in the clockwise direction according to arrow 90 as well as for rotation in the counterclockwise direction according to arrow 91.

The rotation of a tube cathode 11 in one direction is at least 360° in order for all areas of the target 15 to be utilized for sputtering. However, several rotations in the clockwise direction and subsequently the same number of rotations in the counterclockwise direction can be completed. However, the number of rotations in each direction must always be equal.

As a rule, the rotational speed or angular speed of the tube cathode is constant. However, in principle it is also possible to change the angular speed. The effect of the distortion of the magnetic field 60, 61 is greater the higher the rotational speed.

If the tube cathode 11 is rotated n-times at a high speed in the clockwise direction, the resulting distortion error can be compensated at a low speed in the counterclockwise direction with m rotations, wherein m>n.

When using several tube cathodes, which form a so-called cathode array, the angular speeds can also vary from tube cathode to tube cathode.

In FIG. 6 a single cathode is connected to a DC voltage. However, it is also possible to utilize a small cathode pair, which involves two similar cathodes, connected to AC voltage. In this case the cathodes operate alternately as anode and as cathode.

The invention can also be utilized in cathode arrays for static coating. By static coating is understood a coating in which the substrate is at rest during the coating and does not move relative to the cathode. The magnet system can herein be either moved or not moved during the coating relative to the target.

All references cited herein are incorporated by reference in their entireties.

What is claimed is:

1. A method of operating a sputter cathode having a target comprising moving the sputter cathode and target relative to a magnetic field and through the magnetic field, whereby the sputter cathode having the target is moved in a first direction and thereupon in a direction opposite to the first direction, wherein a plurality of the sputter cathodes having a plurality of respective targets are arranged side by side and wherein the targets are electrically conductive, wherein the sputter cathodes are tube cathodes, and wherein said sputter cathodes and respective tubular targets thereof are rotated at an angular speed for about at least 360° in the first direction and thereupon at an angular speed for about at least 360° in a direction opposite to the first direction.

2. A method as claimed in claim 1, wherein the angular speed during one rotation about at least 360° is constant.

3. A method as claimed in claim 1, wherein the angular speed during one rotation about at least 360° is varied.

4. A method as claimed in claim 1, wherein the targets are rotated n times about 360°, where n is an integer and n>1.

5. A method as claimed in claim 1, wherein the longitudinal axes of the tube cathodes are oriented in parallel.

6. A method as claimed in claim 1, wherein the angular speeds of all tube cathodes are equal.

7. A method as claimed in claim 1, wherein the angular speeds of at least two tube cathodes are not equal.

8. A method as claimed in claim 1, wherein a substrate is disposed at a distance from the targets.

9. A method as claimed in claim 5, wherein a substrate is disposed parallel to longitudinal axes of the tube cathodes.

10. A method as claimed in claim 5, wherein the longitudinal axes of the tube cathodes are rotational axes and disposed in a common plane.

11. A method as claimed in claim 9, wherein the longitudinal axes of the tube cathodes are rotational axes and disposed in a common plane.

12. A method as claimed in claim 1, wherein each tube cathode has a target that comprises the same material.

13. A method as claimed in claim 1, wherein a time $t_1$ for the movement in the first direction and a time $t_2$ for the movement in the second direction are equal.

14. A method as claimed in claim 1, wherein a time $t_1$ for the movement in the first direction and a time $t_2$ for the movement in the second direction are not equal.

* * * * *

UNITED STATES PATENT AND TRADEMARK OFFICE
CERTIFICATE OF CORRECTION

PATENT NO.      : 7,575,662 B2                               Page 1 of 1
APPLICATION NO. : 11/170640
DATED           : August 18, 2009
INVENTOR(S)     : Bangert et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 915 days.

Signed and Sealed this

Seventh Day of September, 2010

David J. Kappos
*Director of the United States Patent and Trademark Office*